United States Patent [19]

Lee

[11] Patent Number: 4,515,104
[45] Date of Patent: May 7, 1985

[54] CONTIGUOUS WAFER BOAT

[75] Inventor: Steven N. Lee, Irvine, Calif.

[73] Assignee: ASQ Boats, Inc., Tustin, Calif.

[21] Appl. No.: 494,171

[22] Filed: May 13, 1983

[51] Int. Cl.$^3$ ............................................. B05C 13/02
[52] U.S. Cl. .................................... 118/500; 118/728; 432/253; 211/41
[58] Field of Search ....................... 118/500, 728, 729; 211/41, 48; 432/253, 261; 206/328, 454, 334, 564

[56] References Cited

U.S. PATENT DOCUMENTS 3,534,862  10/1970  Shambelan ............................ 211/41
3,819,067   6/1974  Hammond ........................ 432/253 X
3,828,726   8/1974  Dietz et al. ......................... 211/41 X
4,389,967   6/1983  Shimoda et al. ..................... 118/500
4,412,812  11/1983  Sadowski et al. .............. 432/253 X

FOREIGN PATENT DOCUMENTS 43373   4/1977  Japan ................................. 118/500
134553 10/1979  Japan ................................. 118/728
950052  2/1964  United Kingdom .................. 211/41
1436503 5/1976  United Kingdom .................. 211/41

OTHER PUBLICATIONS

Worden Quartz Products, Inc. product literature (2 sheets), Houston, Texas, publication date unknown.

Primary Examiner—John D. Smith
Assistant Examiner—Bernard F. Plantz
Attorney, Agent, or Firm—Knobbe, Martens, Olson & Bear

[57] ABSTRACT

A quartz boat is formed with a plurality of spaced, parallel rods having slots for supporting a series of semiconductor wafers in a generally edgewise, spaced, parallel position. The slots continue to the ends of the rods, and the cross members supporting the rods are spaced inwardly from the rod ends, such that a series of boats may be arranged with the rods in end-to-end relation and the wafer space between adjacent boats is the same as the wafer space in the middle of a boat. The boat is also provided with a pair of tubes parallel to the rods for receiving a pickup fork.

7 Claims, 5 Drawing Figures

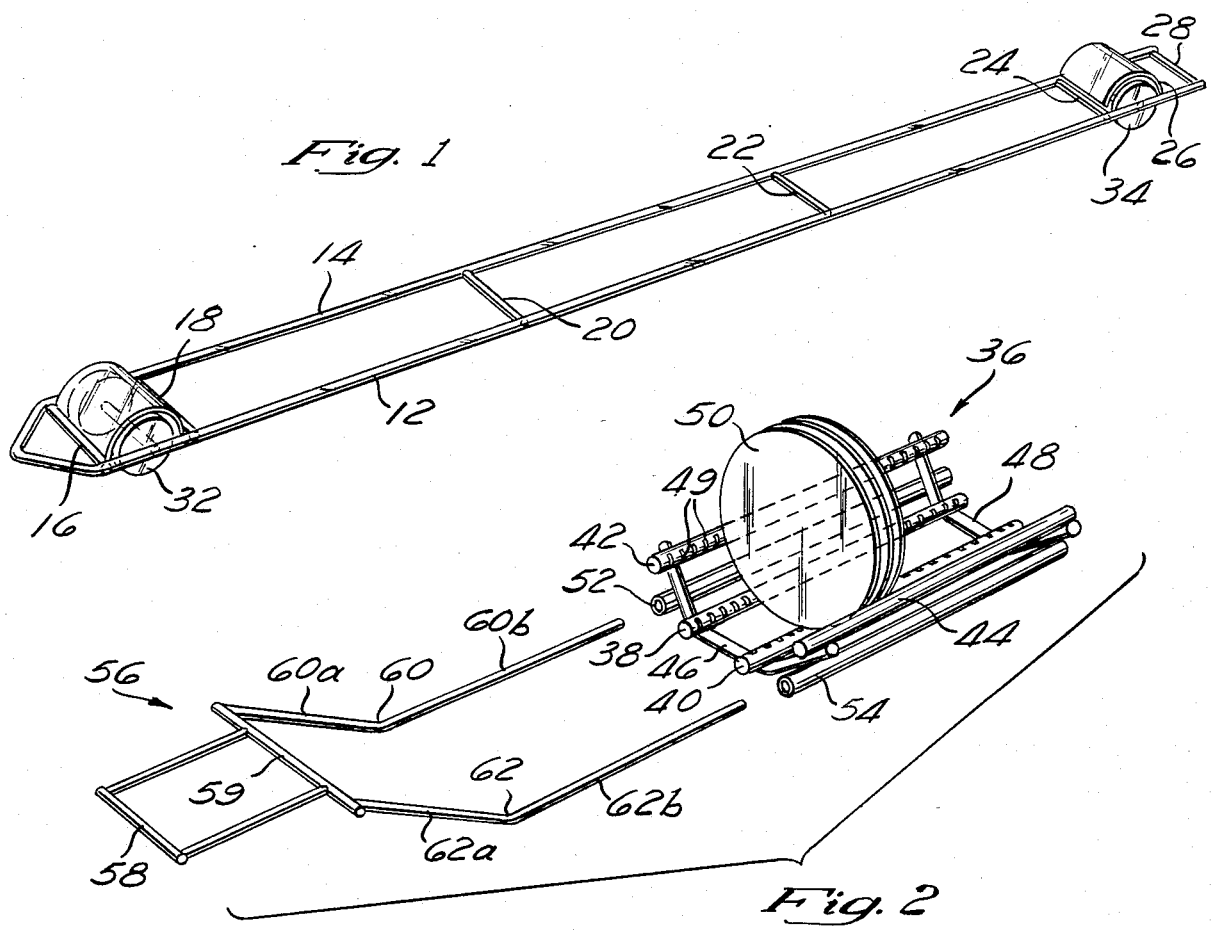
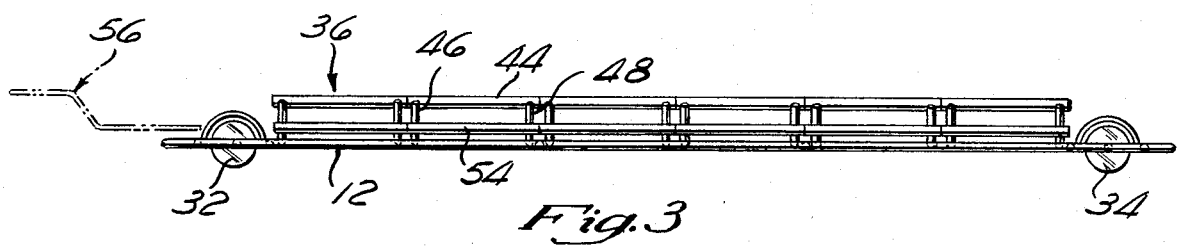
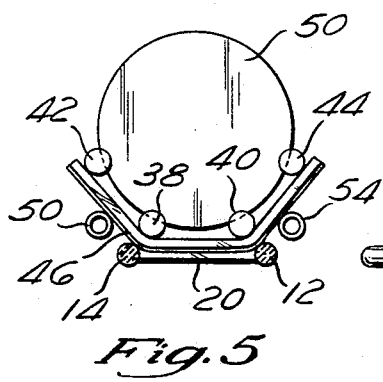

CONTIGUOUS WAFER BOAT

BACKGROUND OF THE INVENTION

This invention relates to the semi-conductor processing industry and particularly to an improved carrier for semi-conductor wafers. In some of the steps for fabricating semi-conductor devices, a batch of the wafers are placed in a cassette or carrier, usually referred to as a "boat", and a group of such boats are placed on an elongated sled or wheeled cart and moved into a furnace for various treatment, such as oxidation, diffusion, annealing and low pressure vapor deposition.

Each boat is provided with a plurality of slots for vertically supporting the wafers in spaced, parallel relation. This is important in that in order to have uniformity between the wafers resulting in a high yield of acceptable product, the gasses that are conducted through the furnace during the wafer processing operation, should preferably flow past each of the wafers in generally the same manner. However, the boats that have been heretofore employed have structure, such as transverse pickup tubes, located at the ends of the boats that enables them to be lifted by a tool and placed onto the cart from the side of the cart. This is a convenient way to position a series of boats on the cart; however, a major disadvantage of this approach is that it creates a wafer gap between the ends of adjacent boats and these gaps produce lack of uniformity of the gas flow past a series of boats filled with wafers, resulting in a low yield of acceptable product. In addition, the gaps represent lost space within the furnace in the sense that no wafers are being treated in the gaps. Accordingly, a need exists for an improved wafer boat that is constructed to eliminate the gaps in a convenient and practical manner.

SUMMARY OF THE INVENTION

In accordance with the invention, an improved boat is provided wherein support members containing slots for positioning a plurality of wafers are connected in a manner such that no connecting or lifting structure extends beyond the ends of the support members. Consequently, the boats can be positioned in end-to-end relation with the wafer-supporting slots continuing to the very ends of the boats so that the spacing between the end wafer of one boat and the end wafer of the next boat is the same as the spacing between the rest of the adjacent wafers. Thus, the wafers are subjected to uniform gas treatment when a cart, loaded with wafer boats, is positioned in a furnace.

In a preferred form of the invention, the boat is formed with a plurality of spaced, parallel slotted rods that are connected by a pair of cross members that are positioned inwardly from the ends of the slotted rods. Thus, these cross members do not interfere with the rods of adjacent boats when positioned in end-to-end relation. Pickup tubes for lifting the boat are strategically secured to the cross members on the lower side of the cross members opposite from the slotted rods, and do not extend beyond the ends of the slotted rods. The pickup tubes are located to straddle the side rods of a support cart so that a pickup fork may be inserted into the tubes easily so as to lift the boat.

DETAILED DESCRIPTION OF THE PREFERRED EMBODIMENT

FIG. 1 is a perspective view of a wheeled cart for supporting a plurality of wafer boats.

FIG. 2 is a perspective view of one boat made in accordance with the invention with the pickup tool in position to be inserted into the pickup tubes on the boat.

FIG. 3 is a side-elevational view of the cart of FIG. 1 with six boats positioned on it.

FIG. 4 is an enlarged side-elevational view showing one end of the cart of FIG. 3 and two boats, together with a portion of a third.

FIG. 5 is a cross-sectional view on line 5—5 of FIG. 4.

Referring first to FIG. 1, the cart or carrier shown therein has a pair of spaced side rods or rails 12 and 14 joined by transversely-extending connecting rods 16, 18, 20, 22, 24, 26 and 28. At the front of the boat is positioned an angularly-shaped tow rod 30 for pulling the cart. A forward wheel assembly 32 is positioned between the two rods 16 and 18, and a rear wheel assembly 34 is positioned between the rods 24 and 26.

Referring to FIG. 2, the boat 36 of the invention includes a pair of lower rods 38 and 40 and a pair of side rods 42 and 44. The rods are positioned in spaced, parallel relation by a pair of connecting cross rods or members 46 and 48 that are fused to the side rods. The cross rods 46 and 48 include a lower central portion 46a and 48a and angled side portions 46b and c and 48b and c. The connection to the lower rods 38 and 40 is at the angle between the side and the lower portions. The side rods 42 and 44 are secured at the upper ends of the side rods. The connection between the cross rods and the parallel rods is spaced inwardly from the ends of the parallel rods. Each of the parallel rods is provided with a series of equally spaced slots 49, sized and aligned to support a plurality of semi-conductor wafers 50 in spaced, parallel relation. The series of slots extend to the ends of the rods, with the distance between the end slot and the end of the rod being equal to one half the distance between adjacent slots.

Secured to the lower side of the cross rods 46 and 48, spaced outwardly from the lower rods 38 and 40, are a pair of quartz tubes 52 and 54 extending parallel to the slotted rods and approximately perpendicular to the wafer slots and the wafers. The length of the tubes is the same as that of the slotted rods.

Also shown in FIG. 2 is a lifting fork 56 having a handle 58, a cross-member 59 joined to the handle and a pair of pickup tines 60 and 62 that include angle portions 60a and 62a that are attached to the cross rod 52 and extend at an angle with respect to the plane of the handle 58. The tines also include portions 60b and 62b which are generally parallel to the handle and are spaced and sized to fit within the pickup tubes 52 and 54.

In use, a boat is filled with a batch of semiconductor wafers 50 and then lifted by the pickup fork 56 and placed on the cart 10 in a position as shown in FIGS. 3, 4 and 5, wherein the side portions of the angled cross rods 46 and 48 rest on the cart side rails 12 and 14. As indicated by the broken line showing in FIG. 3, the fork tines are inserted and withdrawn from the pickup tubes in a direction parallel to the cart side rails 10 and 12 with the tines straddling the cart. Note that the handle extends above the cart wheels.

As may be appreciated from FIGS. 3 and 4, a series of boats are positioned in end-to-end relation, with a total of six boats being positioned on the cart in FIG. 3. Note that the length of the cart and the spacing of the cross rods 20 and 22 is designed such that two boats are positioned between the cross rods 18 and 20 of the cart, two others are positioned between the rods 20 and 22, and the final two are positioned between the rods 22 and 24. The cross support rods 46 and 48 on the boats do not interfere with the cart cross rods 18, 20 and 22.

The most important point, however, is that the gap between the wafers of adjacent boats is the same as the gap between adjacent wafers on a boat. That is, as best seen in FIG. 4, three of the boats are in end-to-end relation with the ends of the slotted rods of one boat engaging the ends of the slotted rods of an adjacent boat. Since the slot on the end of each boat is positioned one-half space from the end of the rod, this one-half space on the end of one boat and the one-half space on the end of the other boat form a single space 64 that is equal to the spaces 65 between the rest of the wafers. The advantage of this, as mentioned above, is that there is no uneven gas flow past the wafers when the cart of wafers is placed in a heat-treating furnace. With the prior art boats, a significant interrupting gap occurs at the intersection between two boats with the result that the wafers are subjected to an uneven gas flow.

The other major advantage of the arrangement illustrated is that without the large gap between the wafers of adjacent boats, a greater quantity of wafers may be positioned on a single cart. It is found that six boats may be positioned on a cart which could previously only handle four or five boats.

When the cart load of boats is removed from a furnace, the boats may be removed from the cart by utilizing the fork 56 in the same manner as when placed on the cart. That is, as shown by the broken line in FIG. 3, the fork 56 is positioned to straddle the cart so that the fork tines 60b and 62b may be inserted into the pickup tubes 52 and 54. It is, of course, important that the boat be carefully handled since the semi-conductors are relatively fragile and can be chipped easily. The cost of a boat of wafers is quite significant such that great care in handling is desirable.

What is claimed is:

1. A boat for supporting a batch of semi conductor wafers comprising support means having a plurality of slots for supporting a series of wafers in spaced, parallel relation with the slots extending from one end of the support means to the other with no obstruction extending beyond the ends so that a second boat of the same kind may be positioned in end-to-end relation with the first boat and the adjacent wafers between the mating ends of the boat will have the same spacing between them as the rest of the adjacent wafers, and a pair of pickup tubes secured to said support, with the tubes extending generally perpendicular to the wafer-receiving spaces defined by the slots, said tubes being sized to receive the tines of a fork-like tool for lifting the boat.

2. The boat of claim 1 wherein said support means includes a plurality of elongated rods arranged in spaced, parallel relation, with said rods having said slots formed therein to receive the wafers, and the support means further includes a pair of cross members secured to said rods and holding the rods in spaced, parallel relation, said cross members being located between the ends of said rods so as not to extend beyond the ends of the rods.

3. A boat for supporting a batch of semi conductor wafers comprising support means having a plurality of slots for supporting a series of wafers in spaced, parallel relation with the slots extending from one end of the support means to the other with no obstruction extending beyond the ends so that a second boat of the same kind may be positioned in end-to-end relation with the first boat and the adjacent wafers between the mating ends of the boat will have the same spacing between them as the rest of the adjacent wafers, and said support means includes a plurality of elongated rods arranged in spaced, parallel relation, with said rods having said slots formed therein to receive the wafers, and the support means further includes a pair of cross members secured to said rods and holding the rods in spaced, parallel relation, said cross members being located between the ends of said rods so as not to extend beyond the ends of the rods, and a pair of elongated pickup tubes extending generally parallel to the plurality of elongated rods which support the wafers and being secured to said cross members on the opposite side from said rods.

4. Apparatus for supporting batches of semi-conductor wafers or other such disc-shaped items comprising an elongated cart or other carrier, a plurality of boats positioned in end-to-end relation on said carrier, each of said boats having a plurality of slots for supporting a batch of semi-conductor wafers in spaced, parallel relation, the end slot of each boat is closely spaced from the end of that boat so that the adjacent wafers at the end of adjacent boats are spaced the same as the rest of the wafers and a pair of pickup tubes on each of said boats extending generally parallel to the end-to-end direction of the boats.

5. The apparatus of claim 4 wherein each of said boats has a plurality of spaced parallel rods with the rods of one boat being positioned in end-to-end alignment with the rods of an adjacent boat, said slots being formed in said rods.

6. The apparatus of claim 5 wherein said carrier has a pair of elongated side rails, and said boat rods includes a pair of bottom rods and a pair of side rods, said rods being held in spaced, parallel relation by a pair of cross rods, including side portions angling upwardly and outwardly from a lower central portion, said cross rod side portions engaging the side rails of the carrier.

7. The apparatus of claim 4 wherein said pair of pickup tubes is positioned below the wafer support slots, with the tubes being spaced from each other to straddle the carrier and thus be accessible for a pickup tool.

* * * * *